US011550007B2

(12) United States Patent
Wang et al.

(10) Patent No.: US 11,550,007 B2
(45) Date of Patent: Jan. 10, 2023

(54) LOCAL COIL AND MAGNETIC RESONANCE IMAGING SYSTEM

(71) Applicant: Siemens Healthcare GmbH, Erlangen (DE)

(72) Inventors: JianMin Wang, Shenzhen (CN); Markus Vester, Nuremberg (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/887,003

(22) Filed: May 29, 2020

(65) Prior Publication Data

US 2020/0379066 A1 Dec. 3, 2020

(30) Foreign Application Priority Data

May 31, 2019 (CN) .......................... 201910469701.2

(51) Int. Cl.
*G01R 33/3415* (2006.01)
*G01R 33/36* (2006.01)

(52) U.S. Cl.
CPC ..... *G01R 33/3415* (2013.01); *G01R 33/3692* (2013.01)

(58) Field of Classification Search
CPC .......................... G01R 33/3415; G01R 33/3692
See application file for complete search history.

(56) References Cited

U.S. PATENT DOCUMENTS

| 5,160,891 | A | * | 11/1992 | Keren | ................. | G01R 33/3415 |
| | | | | | | 324/318 |
| 7,800,368 | B2 | * | 9/2010 | Vaughan | ............... | G01R 33/543 |
| | | | | | | 324/318 |
| 8,148,986 | B2 | * | 4/2012 | Driesel | ............ | G01R 33/34046 |
| | | | | | | 324/318 |
| 9,176,208 | B2 | * | 11/2015 | Kalechofsky | ........ | G01R 33/483 |
| 10,451,692 | B2 | * | 10/2019 | Leussler | .......... | G01R 33/34092 |
| 2003/0001573 | A1 | | 1/2003 | Misic | | |
| 2008/0129298 | A1 | * | 6/2008 | Vaughan | ............... | G01R 33/546 |
| | | | | | | 324/322 |
| 2009/0096553 | A1 | * | 4/2009 | Driesel | ................. | G01R 33/345 |
| | | | | | | 333/219 |
| 2009/0256564 | A1 | | 10/2009 | Greim et al. | | |
| 2012/0249140 | A1 | * | 10/2012 | Albsmeier | ......... | G01R 33/3692 |
| | | | | | | 324/309 |

(Continued)

FOREIGN PATENT DOCUMENTS

CN 101556313 A 10/2009
CN 102809734 A 12/2012

(Continued)

*Primary Examiner* — Dixomara Vargas
(74) *Attorney, Agent, or Firm* — Banner & Witcoff Ltd.

(57) ABSTRACT

Techniques are disclosed for a local coil and a magnetic resonance imaging system. The local coil includes a plurality of coil units that respectively receive magnetic resonance signals generated when magnetic resonance detection is performed on a detected object, and a signal processing unit configured to perform processing including signal preprocessing and quadrature modulation on the magnetic resonance signals received by the plurality of coil units to obtain signals to be transmitted. Contactless connectors are also disclosed, each being configured to couple the signals to be transmitted to a contactless connector at the MR system side.

14 Claims, 3 Drawing Sheets

(56) References Cited

U.S. PATENT DOCUMENTS

| | | | |
|---|---|---|---|
| 2012/0313645 A1 | 12/2012 | Biber et al. | |
| 2014/0163355 A1* | 6/2014 | Kurpad | A61B 5/055 600/417 |
| 2014/0167752 A1* | 6/2014 | Hanada | G01R 33/4816 324/307 |
| 2014/0361769 A1* | 12/2014 | Hardie | G01R 33/34 324/307 |
| 2015/0293194 A1* | 10/2015 | Kalechofsky | G01R 33/3621 600/410 |
| 2016/0077175 A1* | 3/2016 | Mori | G01R 33/307 324/321 |
| 2016/0218689 A1* | 7/2016 | Li | H03H 7/004 |
| 2016/0356867 A1* | 12/2016 | Fujita | G01R 33/3642 |
| 2017/0143203 A1* | 5/2017 | Yang | A61B 5/004 |
| 2018/0003791 A1* | 1/2018 | Kimmlingen | G01R 33/561 |
| 2018/0067178 A1 | 3/2018 | Cheng et al. | |
| 2018/0067180 A1 | 3/2018 | Tong et al. | |
| 2018/0246179 A1* | 8/2018 | Zhai | G01R 33/3875 |
| 2019/0018089 A1 | 1/2019 | Ji et al. | |
| 2019/0178960 A1* | 6/2019 | Halperin | G01R 33/287 |
| 2019/0310328 A1* | 10/2019 | Fuqua | G01R 33/34084 |
| 2020/0408861 A1* | 12/2020 | Park | G01R 33/3635 |

FOREIGN PATENT DOCUMENTS

| | | |
|---|---|---|
| CN | 206990783 U | 2/2018 |
| CN | 107797084 A | 3/2018 |
| WO | 2013027710 A1 | 2/2013 |
| WO | 2018098355 A1 | 5/2018 |

* cited by examiner

LOCAL COIL AND MAGNETIC RESONANCE IMAGING SYSTEM

CROSS-REFERENCE TO RELATED APPLICATIONS

The present application claims the benefit of the filing date of China patent application no. CN 201910469701.2, filed on May 31, 2019, the contents of which are incorporated herein by reference in their entirety.

TECHNICAL FIELD

The present disclosure relates to the field of medical devices and, in particular, to a local coil system used as part of a magnetic resonance imaging system.

BACKGROUND

In a magnetic resonance imaging (MRI) system, a local coil is usually used to improve the signal-to-noise ratio (SNR) level, thus improving the image quality. Currently, the local coil can have as many as 32 or 64 coil elements to achieve optimal coverage and SNR. Signals received from the local coil need to be connected to the MRI system. A conventional local coil connects all local coil signals to the MRI system using a coil plug with a radio frequency coaxial connector. Due to the limitations on weight and size, the coil plug usually has 8-12 radio frequency pins to connect 8-12 coil element signals. The coil plugs are precision mechanical parts, which need to be carefully inserted together, which are otherwise easily broken. In addition, the coil plug is also a complicated mechanical part, which is difficult to clean. Thus, current local coil solutions have various drawbacks.

SUMMARY

In view of this, in embodiments of the present disclosure are directed to a local coil applied to a magnetic resonance (MR) system, so as to simplify the connection between the local coil and the MR system.

The local coil provided in the embodiment of the present disclosure comprises: a plurality of coil units (e.g. coils) configured to respectively receive magnetic resonance signals generated when magnetic resonance detection is performed on a detected object; a signal processing unit configured to perform processing including signal preprocessing and quadrature modulation on the magnetic resonance signals received by the plurality of coil units, so as to obtain signals to be transmitted; and first contactless connectors, each configured to couple the signals to be transmitted to a first contactless connector at an MR system side.

In an embodiment, the plurality of coil units are divided into 2M coil unit groups, where M is an integer greater than or equal to 1 and less than or equal to $$\frac{N}{2},$$

and N is a number of the coil units and is an integer greater than or equal to 2. The signal processing unit comprises: 2M signal preprocessing units correspondingly connected to the 2M coil unit groups on a one-to-one basis, each of the signal preprocessing units being configured to perform set (e.g. predetermined) preprocessing on magnetic resonance signals received by each of the coil units in the corresponding coil unit group so as to obtain a preprocessed signal that meets requirements; 2M low-pass filters correspondingly connected to the 2M signal preprocessing units on a one-to-one basis, each of the low-pass filters being configured to perform low-pass filtering on the preprocessed signal output by the corresponding signal preprocessing unit; and M quadrature modulators, each of the quadrature modulators corresponding to two low-pass filters and configured to perform quadrature modulation on signals output by the two low-pass filters according to a set carrier frequency so as to obtain a signal to be transmitted; and L first contactless connectors, with L being a positive integer less than or equal to M, and each of the first contactless connectors correspondingly connected to at least one quadrature modulator and configured to couple signals to be transmitted output by the at least one quadrature modulator to the corresponding first contactless connector among the L first contactless connectors at the MR system side.

In one embodiment, one or more radio frequency traps are arranged between each quadrature modulator and the correspondingly connected first contactless connector.

In one embodiment, the local coil further comprises: a second contactless connector, which is respectively connected to the plurality of coil units, the 2M signal preprocessing units, the 2M low-pass filters, and the M quadrature modulators, and is configured to couple and receive power and clock signals transmitted through a second contactless connector at the MR system side and provide the power and clock signals to the coil units, the signal preprocessing units, the low-pass filters, and the quadrature modulators.

In one embodiment, the first contactless connectors and/or the second contactless connectors are inductive coupling connectors, capacitive coupling connectors, or microwave coupling connectors.

In one embodiment, the capacitive coupling connectors are implemented by means of two copper sheets which are not in contact with each other.

In one embodiment, the copper sheet has a box-type structure, one end face of the box-type structure is provided with an annular hole, a structure inside the annular hole is a signal connection block, and a structure outside the annular hole is a grounding block.

In one embodiment, N is 16, M is 1, the bandwidth is 80 MHz, the carrier frequency is 1 GHz, and there is a gap of 3 mm between a signal connection block in the capacitive coupling connector at a local coil side and a signal connection block in the capacitive coupling connector at the MR system side.

In one embodiment, the copper sheet has a flat plate structure, and the flat plate structure is composed of two strip-shaped plates with a set distance, ends of the two strip-shaped plates are connected to form a signal connection end, and the other ends of the two strip-shaped plates are also connected to form a matching (e.g. grounding) end.

In one embodiment, N is 16, M is 1, a the bandwidth is 80 MHz, the carrier frequency is 1 GHz, and there is a gap of 5 mm between the capacitive coupling connector at the local coil side and the capacitive coupling connector at the MR system side.

In one embodiment, each of the signal preprocessing units comprises: a plurality of preamplifiers correspondingly connected to coil units in a coil unit group corresponding to the signal preprocessing unit on a one-to-one basis, each of the preamplifiers being configured to amplify magnetic resonance signals received by the corresponding coil unit; and a plurality of band-pass filters correspondingly connected to the plurality of preamplifiers on a one-to-one basis, each of the band-pass filters being configured to perform band-pass filtering on magnetic resonance signals output by the corresponding preamplifier.

In one embodiment, each of the signal preprocessing units further comprises: a signal multiplexer, which has a plurality of input ports that are correspondingly connected to output ends of the plurality of band-pass filters on a one-to-one basis, and is configured to multiplex signals output by the plurality of band-pass filters into a signal that works in conjunction with the signal bandwidth.

In one embodiment, each of the signal preprocessing units further comprises: a plurality of frequency converters, each of the frequency converters being connected behind one band-pass filter and configured to convert magnetic resonance signals output by the corresponding band-pass filter into preset low-frequency magnetic resonance signals and provide the low-frequency magnetic resonance signals to the signal multiplexer.

In one embodiment, the signal multiplexer is a frequency division multiplexer or a time division multiplexer.

The MR system provided in the embodiments of the present disclosure comprises the local coil in any of the implementations above.

It can be seen from the solution above that, in the embodiment of the present disclosure, the local coil is connected to the MR system by using a contactless connector, the internal structure of the local coil is reconstructed, and a signal processing unit, which is configured to perform processing including signal multiplexing and quadrature modulation on magnetic resonance signals received by the plurality of coil units, is arranged inside the local coil, so as to obtain signals to be transmitted that can be transmitted in a contactless coupled manner. In this way, the contactless connector can perform non-pin contact coupling connection by using a flat insulating housing (such as a plastic housing), which not only facilitates connection, but also has a firm structure and makes it easy to clean. In addition, the contactless connectors can be used at multiple locations of a wiring path alone. For example, the contactless connectors can be used to connect a coil to a patient examination couch or to connect a patient examination couch to an MR system. In this way, the patient examination couch can be docked with the MR system without the need for a precision radio frequency connector. This makes the examination couch more convenient for frequent daily use.

In addition, an embodiment of the present disclosure further provides a signal processing unit including signal preprocessing units, low-pass filters, and quadrature modulators, and the signal processing unit is easy to implement.

In addition, in other embodiments, the local coil may further comprise a second contactless connector configured to couple power and clock signals from the MR system in a contactless connection manner, and to provide the signals to the coil units, the signal processing unit, low-pass filter units, and the quadrature modulators.

Further, in an embodiment of the present disclosure, one or more radio frequency traps are arranged between the quadrature modulators and the first contactless connectors, and between the second contactless connector and the multiplexer according to design needs, thereby reducing or eliminating interferences possibly caused by radio frequency cables at a magnetic resonance frequency to magnetic resonance signals.

In addition, an embodiment of the present disclosure further provides two specific implementation solutions for the signal preprocessing unit, and higher-quality preprocessed signals can be obtained by means of the two implementation solutions.

In addition, an embodiment of the present disclosure further provides two specific implementation solutions for a capacitive coupler, and the two implementation solutions allow for a simple structure and are easy to implement.

Further, an embodiment of the present disclosure further provides a radio frequency trap, which is easy to implement and has a smaller size.

In addition, the use of a time division multiplexing technique in the signal preprocessing unit can significantly reduce the number of cables and simplify the work flow.

BRIEF DESCRIPTION OF THE DRAWINGS/FIGURES

The above and other features and advantages of the present disclosure will be more apparent to those of ordinary skill in the art from the detailed description of preferred embodiments of the present disclosure with reference to the accompanying drawings, in which.

Figure 1:
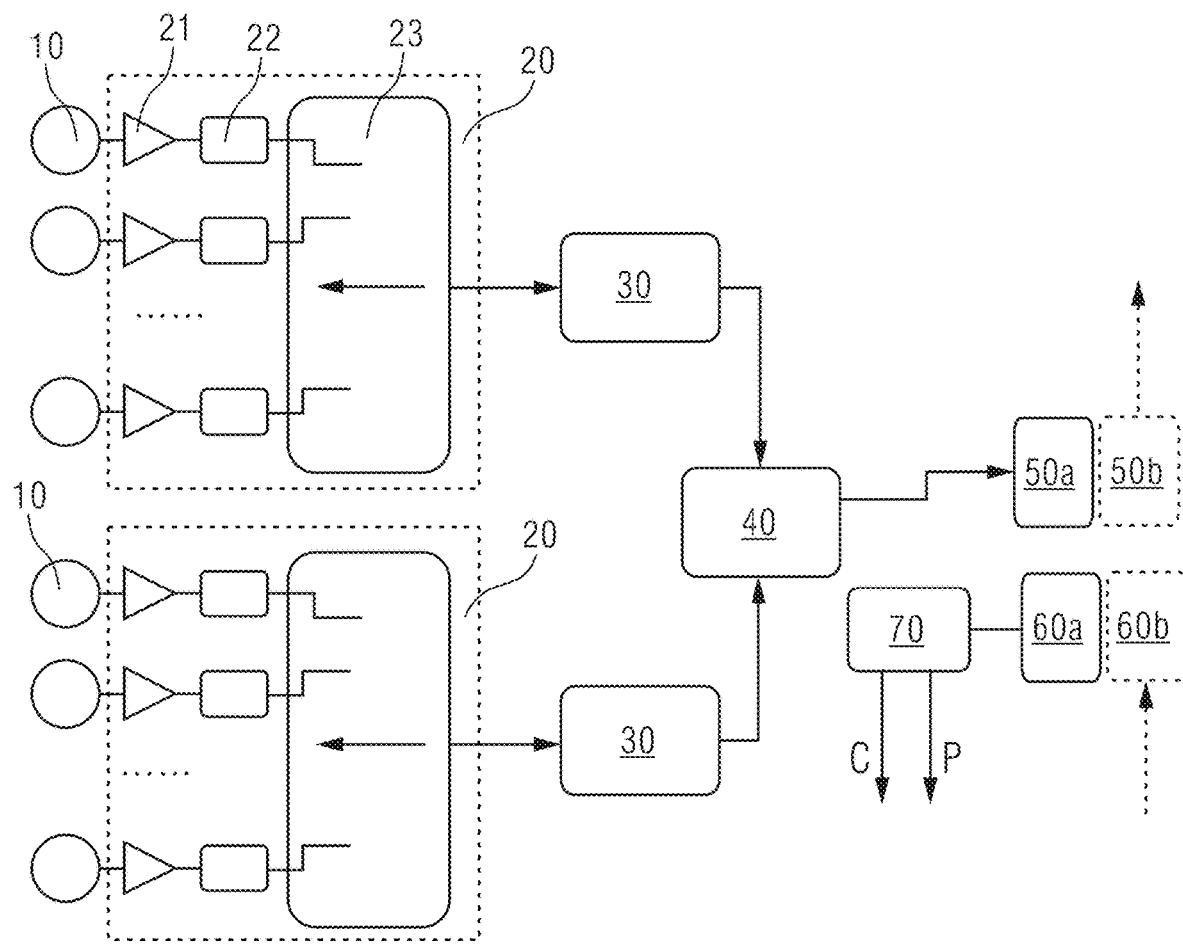
FIG. 1 is a schematic structural diagram of an example local coil, in accordance with one or more embodiments of the present disclosure.

Reference numerals in the accompanying drawings are as follows.

| Reference numerals | Meaning |
|---|---|
| 10 | Coil unit |
| 20 | Signal processing unit |
| 21 | Preamplifier |
| 22 | Band-pass filter |
| 23 | Signal multiplexer |
| 30 | Low-pass filter |
| 40 | Quadrature modulator |
| 50a, 50b | First contactless connector |
| 51 | Annular hole |
| 52 | Signal connection block |
| 53 | Grounding block |
| 54, 55 | Strip-shaped plate |
| 56 | Signal connection end |
| 57 | Matching end |
| 60a, 60b | Second contactless connector |
| 70 | Power and clock signal multiplexer |
| L1, L2 | Inductor |
| C1 | Capacitor |

DETAILED DESCRIPTION

In embodiments of the present disclosure, to simplify the connection between a local coil and a system and solve the aforementioned issues that a pin plug is easily broken and is difficult to clean, the local coil is considered to be connected to the MR system by means of a contactless connector, such as an inductive coupling connector, a capacitive coupling connector, a microwave coupling connector, etc. In this way, the contactless (e.g. a non-galvanic connection) connector can perform a non-pin contact coupling connection by using a flat insulating housing (such as a plastic housing), which not only facilitates connection, but also makes it easy to clean. In order to implement such a contactless connection between the local coil and the system, the internal structure of the local coil also needs to be reconstructed. To do so, embodiments include arranging a signal processing unit inside the local coil for performing processing, including signal preprocessing, and quadrature modulation on magnetic resonance signals received by the plurality of coil units, so as to obtain signals to be transmitted that can be transmitted in a contactless coupling manner.

In various embodiments, the signal processing unit may be implemented in various manners. For example, the signal processing unit may comprise a signal preprocessing unit configured to preprocess magnetic resonance signals, a filter configured to perform low-pass filtering on the preprocessed signals, and a quadrature modulator configured to perform quadrature modulation on the low-pass filtered signals, such that the quadrature-modulated signals can be coupled through contactless connectors. For example, in an embodiment, the local coil may comprise N coil units, 2M signal preprocessing units, 2M low-pass filters, M quadrature modulators, and L first contactless connectors, where N is an integer greater than or equal to 2, M is an integer greater than or equal to 1 and less than or equal to $$\frac{N}{2},$$

and L is a positive integer less than or equal to M.

In addition, in other embodiments, the local coil may further comprise a second contactless connector, which is configured to couple and receive power and clock signals transmitted through a second contactless connector at the system side and provide the power and clock signals to the coil units, the signal preprocessing units, the low-pass filters and the quadrature modulators.

In order to make the object, technical solutions, and advantages of the present disclosure more apparent, the present disclosure will be described in further detail by way of embodiments hereinafter.

FIG. 1 is a schematic structural diagram of an example local coil, in accordance with one or more embodiments of the present disclosure. As shown in FIG. 1, the local coil comprises 16 coil units 10 (in this embodiment, the case where N is 16 is taken as an example), two signal preprocessing units 20 (in this embodiment, the case where M is 1 is taken as an example), two low-pass filters 30 (in this embodiment, the case where M is 1 is taken as an example), one quadrature modulator 40 (in this embodiment, the case where M is 1 is taken as an example), one first contactless connector 50a (in this embodiment, the case where L is 1 is taken as an example), and one second contactless connector 60a. Embodiments include the local coil including any suitable number of components, and the aforementioned numbers are provided by way of example and not limitation.

The 16 coil units 10 can respectively receive magnetic resonance signals generated when magnetic resonance detection is performed on a detected object. Magnetic resonance detection may be, for instance, part of a magnetic resonance imaging procedure that is performed by the MR system. In this embodiment, the 16 coil units 10 are divided into two coil unit groups.

In an embodiment of the present disclosure, the grouping of the coil units 10 may be performed according to the number of signal preprocessing units 20. For example, if there are two signal preprocessing units 20, the coil units 10 are divided into two groups, and if there are four signal preprocessing units 20, the coil units 10 are divided into four groups.

The two signal preprocessing units 20 are correspondingly connected to the two coil unit groups on a one-to-one basis, and each of the signal preprocessing units 20 is configured to perform set processing (e.g. predetermined processing) on magnetic resonance signals received by each of the coil units 10 in the corresponding coil unit group, and multiplex the processed magnetic resonance signals into a preprocessed signal that meets set requirements (e.g. predetermined or established specifications or requirements).

In an embodiment of the present disclosure, the signal preprocessing unit 20 can be implemented in many specific ways, only one of which is shown in the present example embodiment of the disclosure. For example, as shown in FIG. 1, each of the signal preprocessing units 20 may comprise 8 preamplifiers 21, 8 band-pass filters 22, and one signal multiplexer 23.

The 8 preamplifiers 21 are correspondingly connected to 8 coil units 10 in a coil unit group corresponding to the signal preprocessing unit 20 on a one-to-one basis, and each of the preamplifiers 21 is configured to amplify magnetic resonance signals received by the corresponding coil unit 10.

The 8 band-pass filters 22 are correspondingly connected to the 8 preamplifiers 21 on a one-to-one basis, and each of the band-pass filters 22 is configured to perform band-pass filtering on magnetic resonance signals output by the corresponding preamplifier 21.

The signal multiplexer 23 has 8 input ports that are correspondingly connected to output ends of the 8 band-pass filters, respectively, on a one-to-one basis, and is configured to multiplex signals output by the 8 band-pass filters into a signal that meets a predetermined or set bandwidth. In an embodiment of the present disclosure, the signal multiplexer 23 may be a frequency division multiplexer or a time division multiplexer. For example, in an embodiment, if the signal multiplexer 23 is a 20 MHz time division multiplexer, 8 magnetic resonance signals can be multiplexed into a signal with a bandwidth of 80 MHz. In some embodiments, the signal multiplexer 23 may not be used according to the actual situation. For example, the signal multiplexer is not used when N=2 and M=1, or when N=4 and M=2.

In addition, In other embodiments, each of the signal preprocessing units 20 may further comprise: 8 frequency converters (not shown in FIG. 1), each of the frequency converters being connected to at least one band-pass filter 22 and configured to convert magnetic resonance signals output by the corresponding band-pass filter 22 into preset (e.g. predetermined) low-frequency magnetic resonance signals and output the low-frequency magnetic resonance signals to the signal multiplexer 23 for signal multiplexing (e.g. in series and between the band-pass filter 22 and the signal multiplexer 23).

Two low-pass filters 30 are correspondingly connected to the two signal preprocessing units 20 on a one-to-one basis, and each of the low-pass filters 30 is configured to perform low-pass filtering on the signal output by the corresponding signal preprocessing unit 20.

The quadrature modulator 40 has two input ports that are correspondingly connected to the two low-pass filters 30 and is configured to perform quadrature modulation on signals output by the two low-pass filters 30 according to a set or predetermined carrier frequency, so as to obtain a signal to be transmitted. For example, in one embodiment, the carrier frequency may be 1 GHz.

The first contactless connector 50a is connected to the quadrature modulator 40 and is configured to couple the signals to be transmitted output by the quadrature modulator 40 to a first contactless connector 50b at an MR system side.

The second contactless connector 60a is respectively connected to the 16 coil units 10, the two signal preprocessing units 20, the two low-pass filters 30 and the quadrature modulators 40 through a power and clock signal multiplexer 70, and configured to couple and receive power and clock signals transmitted through one second contactless connector 60b at the system side, obtain power P and a clock signal C through decomposition by the multiplexer 70, and provide the power and clock signal to the coil units 10, the signal preprocessing units 20, low-pass filter units 30, and the quadrature modulators 40.

In an embodiment, considering that the radio cables between the quadrature modulators 40 and the first contactless connector 50a and between the second contactless connector 60a and the multiplexer 70 may interfere with magnetic resonance signals at a magnetic resonance frequency (usually 63.6 MHz or 123.2 MHz), one or more radio frequency traps may be arranged between the quadrature modulator 40 and the first contactless connector 50a and between the second contactless connector 60a and the multiplexer 70 according to actual needs.

Figure 2:
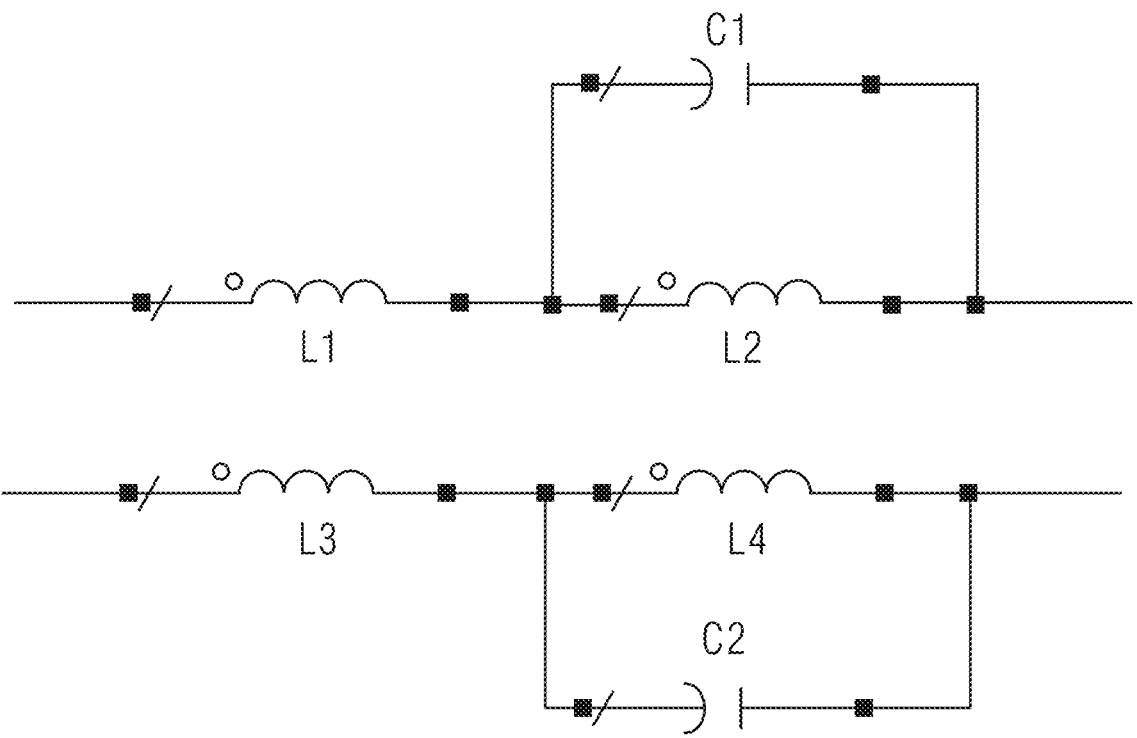
FIG. 2 is a schematic structural diagram of an example radio frequency trap, in accordance with one or more embodiments of the present disclosure.

FIG. 2 is a schematic structural diagram of an example radio frequency trap, in accordance with one or more embodiments of the present disclosure. As shown in FIG. 2, the radio frequency trap comprises two symmetrical parts, which are respectively connected to an inner core layer and an outer sleeve layer of a radio frequency cable, and each of the parts comprises two inductors L1 and L2 connected in series with each other and a capacitor C1 connected in parallel with the inductor L2.

The first contactless connectors 50a and 50b and/or the second contactless connectors 60a and 60b may be inductive coupling connectors, capacitive coupling connectors, or microwave coupling connectors. The specific type can be determined according to actual needs. In an embodiment of the present disclosure, the capacitive coupling connector is taken as an example for brevity.

In an embodiment, the capacitive coupling connector can be implemented by using two copper sheets or other conductors, which are not in contact (e.g. not galvanically connected) with each other.

Figure 3A:
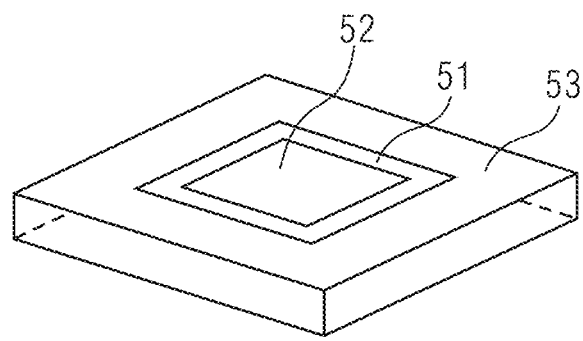
FIG. 3A is a structural diagram of an example single-sided capacitive coupling connector, in accordance with one or more embodiments of the present disclosure.
Figure 3B:
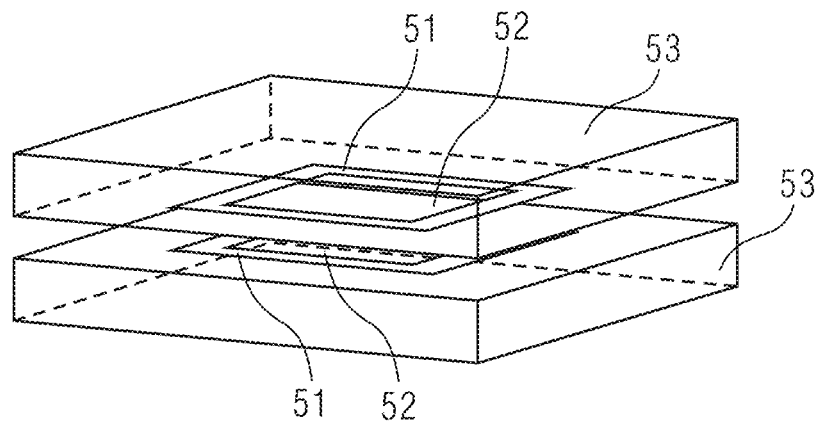
FIG. 3B is a structural diagram of an example double-sided capacitive coupling connector, in accordance with one or more embodiments of the present disclosure.

For example, FIGS. 3A and 3B are exemplary structural diagrams of one capacitive coupling connector in an embodiment of the present disclosure. FIG. 3A shows a single-sided capacitive coupling connector, and FIG. 3B shows a double-sided capacitive coupling connector.

Referring to FIGS. 3A and 3B, it can be seen that the copper sheet in this embodiment can have a box-type structure (herein, the capacitive couplers at the local coil side and at the system side are the same in structure, and therefore, the same reference numerals are used at both sides), one end face of the box-type structure is provided with an annular hole 51, a structure inside the annular hole 51 is a signal connection block 52, and a structure outside the annular hole is a grounding block 53. In specific implementation, an insulating support block may be arranged on the grounding block 53, and the signal connection block 52 is fixed on the insulating support block.

In an embodiment, a gap having any suitable size (e.g. 3 mm, 2 mm, 1 mm, 4 mm, 5 mm, etc.) may be provided between a signal connection block 52 in the capacitive coupling connector at a local coil side and a signal connection block in the capacitive coupling connector at the MR system side as shown in FIGS. 3A and 3B.

Figure 4:
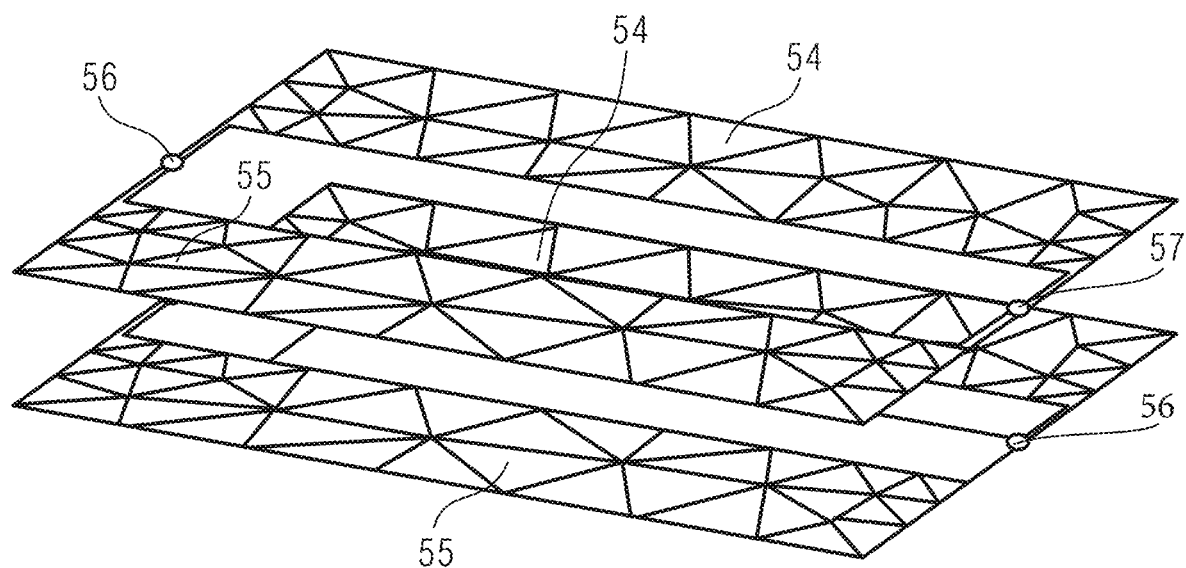
FIG. 4 is a structural diagram of another example capacitive coupling connector, in accordance with one or more embodiments of the present disclosure.

FIG. 4 is a structural diagram of another example capacitive coupling connector, in accordance with one or more embodiments of the present disclosure. A double-sided capacitive coupling connector is shown in FIG. 4. As shown in FIG. 4, the copper sheet in this embodiment may have a flat plate structure (herein, the reference numerals are only marked at one side, and the structure at the other side corresponds thereto), and the flat plate structure is composed of two strip-shaped plates 54 and 55 with a set distance, ends of the two strip-shaped plates 54 and 55 are connected to form a signal connection end 56, and the other ends of the two strip-shaped plates 54 and 55 are also connected to form a matching end 57.

In an embodiment, a having any suitable size (e.g. 5 mm, 4 mm, 3 mm, 6 mm, 7 mm, etc.) may be provided between the capacitive coupling connector at the local coil side and the capacitive coupling connector at the system side shown in FIG. 4.

The magnetic resonance system in an embodiment of the present disclosure may comprise the local coil in any of the implementations above.

It can be seen from the solution above that, in the embodiments of the present disclosure, the local coil is connected to the system by using a contactless connector, the internal structure of the local coil is reconstructed, and a signal processing unit configured to perform processing including signal multiplexing and quadrature modulation on magnetic resonance signals received by the plurality of coil units is arranged inside the local coil, so as to obtain signals to be transmitted that can be transmitted in a contactless coupling manner, such that the contactless connector can perform non-pin contact coupling connection by using a flat insulating housing (such as a plastic housing). This not only facilitates connection, but also has a firm structure and makes it easy to clean. In addition, the contactless connectors can be used at multiple locations of a wiring path alone. For example, the contactless connectors can be used to connect a coil to a patient examination couch or connect a patient examination couch to a system. In this way, the patient examination couch can be docked with the MR system without the need for a precision radio frequency connector. This makes the examination couch more convenient for frequent daily use.

In addition, embodiments of the present disclosure further provide a signal processing unit including signal preprocessing units, low-pass filters, and quadrature modulators, and the signal processing unit is easy to implement.

In addition, in other embodiments, the local coil may further comprise a second contactless connector configured to couple power and clock signals from the system in a contactless connection manner and provide the signals to the coil units, signal processing units, low-pass filter units, and quadrature modulators.

Further, in embodiments of the present disclosure, one or more radio frequency traps are arranged between the quadrature modulators and the first contactless connectors and between the second contactless connector and the multiplexer according to actual needs, thereby reducing or eliminating interferences possibly caused by radio frequency cables at a magnetic resonance frequency to magnetic resonance signals.

In addition, embodiments of the present disclosure further provide two specific implementation solutions for the signal preprocessing unit, and higher-quality multiplexed signals can be obtained by means of the two implementation solutions.

In addition, the embodiments of the present disclosure further provide two specific implementation solutions for a capacitive coupler, and the two implementation solutions allow for a simple structure and are easy to implement.

Further, the embodiments of the present disclosure further provide a radio frequency trap that is easy to implement and has a smaller size.

In addition, the use of a time division multiplexing technique in the signal preprocessing unit can significantly reduce the thickness of cables and simplify the work flow.

The above descriptions are merely preferred embodiments of the present disclosure but not intended to limit the present disclosure, and any modifications, equivalent replacements, improvements, etc. made within the spirit and principle of the present disclosure should be included within the scope of protection of the present disclosure.

The various functional blocks, apparatuses, modules, units, components of physical or functional units, etc., as shown in the drawings and described herein may be implemented via any suitable number and type of computer processors, hardware components, the execution of software algorithms, or combinations thereof, and thus may alternatively be referred to as a "unit," "system," "circuitry," or a "device."

What is claimed is:

1. A local coil for a magnetic resonance (MR) system, comprising:
   a plurality of coils configured to respectively receive magnetic resonance signals generated when magnetic resonance detection is performed on a detected object as part of a magnetic resonance imaging procedure executed via the MR system;
   signal processing circuitry configured to perform signal preprocessing and quadrature modulation on the received magnetic resonance signals to obtain signals to be transmitted; and
   first contactless connectors at the local coil side, each contactless connector from among the first contactless connectors being configured to couple a respective signal from among the signals to be transmitted to a corresponding first contactless connector at the MR system side,
   wherein the plurality of coils are divided into a number 2M of coil groups, with M representing an integer greater than or equal to 1 and less than or equal to $$\frac{N}{2},$$

and N representing a number of the plurality of coils and is an integer greater than or equal to 2,
   wherein the signal processing circuitry comprises:
      a number 2M of signal preprocessing units, each of the signal preprocessing units being respectively connected to the coil groups on a one-to-one basis, and each of the signal preprocessing units being configured to perform signal preprocessing on the magnetic resonance signals received by each of the coils in a corresponding coil group to obtain a preprocessed signal;
      a number 2M of low-pass filters, each of the low pass filers being respectively connected to the signal preprocessing units on a one-to-one basis, and each of the low-pass filters being configured to perform low-pass filtering on a preprocessed signal output by a corresponding signal preprocessing unit; and
      a number M of quadrature modulators, each of the quadrature modulators corresponding to two of the low-pass filters and being configured to perform quadrature modulation on signals output by the two of the low-pass filters according to a carrier frequency to obtain a signal to be transmitted; and
   a number L of first contactless connectors, with L being a positive integer less than or equal to M, and each of the L first contactless connectors being respectively connected to at least one of the quadrature modulators and being configured to couple signals to be transmitted output by the at least one quadrature modulator to a corresponding first contactless connector at the MR system side.

2. The local coil as claimed in claim 1, further comprising:
   one or more radio frequency traps arranged between each quadrature modulator and a correspondingly connected one of the first contactless connectors at the local coil side.

3. The local coil as claimed in claim 1, further comprising:
   a second contactless connector at the local coil side respectively connected to the plurality of coils, the signal preprocessing units, the low-pass filters, and the quadrature modulators, the second contactless connector being configured to couple and receive power and clock signals transmitted through a corresponding second contactless connector at the MR system side and to provide the power and clock signals to the plurality of coils, the signal preprocessing units, the low-pass filters, and the quadrature modulators.

4. The local coil as claimed in claim 1, wherein the signal processing circuitry comprises:
   a plurality of preamplifiers correspondingly connected to coils from among the plurality of coils on a one-to-one basis, each of the preamplifiers being configured to amplify magnetic resonance signals received by a corresponding coil; and
   a plurality of band-pass filters correspondingly connected to each of the plurality of preamplifiers on a one-to-one basis, each of the plurality of band-pass filters being configured to perform band-pass filtering on magnetic resonance signals output by a corresponding preamplifier.

5. The local coil as claimed in claim 4, wherein the signal processing circuitry further comprises:
   a signal multiplexer having a plurality of input ports that are correspondingly connected to output ends of the plurality of band-pass filters on a one-to-one basis, the signal multiplexer being configured to multiplex signals output by the plurality of band-pass filters.

6. The local coil as claimed in claim 5, wherein the signal processing circuitry further comprises:
   a frequency converter connected in series with at least one of the plurality of band-pass filters and configured to convert magnetic resonance signals output by the correspondingly connected at least one of the plurality of band-pass filters to a predetermined low-frequency magnetic resonance signal, and to provide the low-frequency magnetic resonance signal to the signal multiplexer.

7. The local coil as claimed in claim 5, wherein the signal multiplexer is one of a frequency division multiplexer or a time division multiplexer.

8. The local coil as claimed in claim 1, further comprising:

second contactless connectors at the local coil side, each contactless connector from among the second contactless connectors being configured to couple a respective signal from among the signals to be transmitted to a corresponding second contactless connector at the MR system side, wherein the second contactless connectors at the local coil side and/or the second contactless connectors at the MR system side include at least one of inductive coupling connectors, capacitive coupling connectors, or microwave coupling connectors.

9. The local coil as claimed in claim 1, wherein the first contactless connectors at the local coil side and/or the corresponding first contactless connectors at the MR system side include at least one of inductive coupling connectors, capacitive coupling connectors, or microwave coupling connectors.

10. The local coil as claimed in claim 9, wherein the capacitive coupling connectors include two copper sheets that are not in contact with one other.

11. The local coil as claimed in claim 10, wherein:
at least one of the two copper sheets has a box-type structure,
one end face of the box-type structure includes an annular hole,
a structure inside the annular hole is a signal connection block, and
a structure outside the annular hole is a grounding block.

12. The local coil as claimed in claim 10, wherein:
N is 16,
M is 1,
the carrier frequency is 1 GHz, and
a gap is formed between a signal connection block in the capacitive coupling connector at the local coil side and a signal connection block in the capacitive coupling connector at the MR system side.

13. The local coil as claimed in claim 10, wherein:
the capacitive coupling connectors include two copper sheets each have a flat plate structure and include a first strip-shaped plate and a second strip-shaped plate spaced apart from one another, with each of the first strip-shaped plate and the second strip-shaped plate including a signal connection end and a matching end.

14. The local coil as claimed in claim 13, wherein:
N is 16,
M is 1, and
a gap is formed between the capacitive coupling connector at the local coil side and the capacitive coupling connector at the MR system side.

* * * * *